United States Patent [19]

Croset et al.

[11] 3,967,371
[45] July 6, 1976

[54] METHODS OF MANUFACTURING MULTILAYER INTERCONNECTIONS FOR INTEGRATED CIRCUITS AND TO INTEGRATED CIRCUITS UTILIZING SAID METHOD

[75] Inventors: Michel Croset; Noel Nouailles, both of Paris, France

[73] Assignee: Sescosem- Societe Europeenne des Semi-Conducteurs et de Microelectronique, Paris, France

[22] Filed: Aug. 21, 1973

[21] Appl. No.: 390,298

Related U.S. Application Data

[63] Continuation of Ser. No. 269,871, July 7, 1972, abandoned, which is a continuation of Ser. No. 102,379, Dec. 29, 1970, abandoned.

[30] Foreign Application Priority Data

Jan. 6, 1970   France .............................. 70.00288

[52] U.S. Cl. .................................. 29/625; 29/590; 174/68.5; 317/101 A
[51] Int. Cl.² ......................................... H01L 21/88

[58] Field of Search ................ 174/68.5; 317/101 A, 317/101 CM, 101 CE, 234 J, 234 M, 234 N; 29/588–590, 625–627, 577, 591

[56]   References Cited
   UNITED STATES PATENTS
3,461,347   8/1969   Lemelson ....................... 174/68.5 X

*Primary Examiner*—Darrell L. Clay
*Attorney, Agent, or Firm*—Cushman, Darby & Cushman

[57]   ABSTRACT

A method of manufacturing multilayer interconnections for interconnecting several mutually insulated groups of contact zones formed on an integrated circuit semiconductor chip is provided.

The adjacent superimposed interconnection films are separated by an insulating film of a metal oxide produced by the total oxidation of a metal film deposited on the chip prior to the formation of the top layer of interconnections. The metal deposited at the locations of the contact zones is protected against oxidation so that the contact zones are all times accessible at the surface.

3 Claims, 10 Drawing Figures

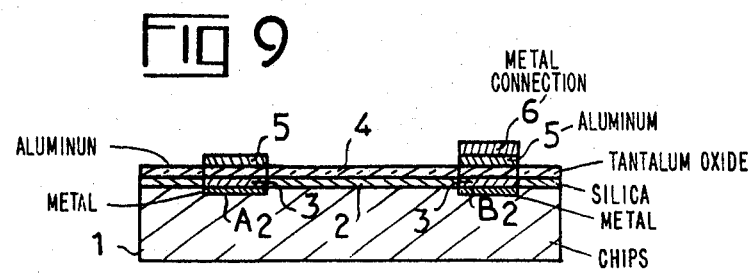
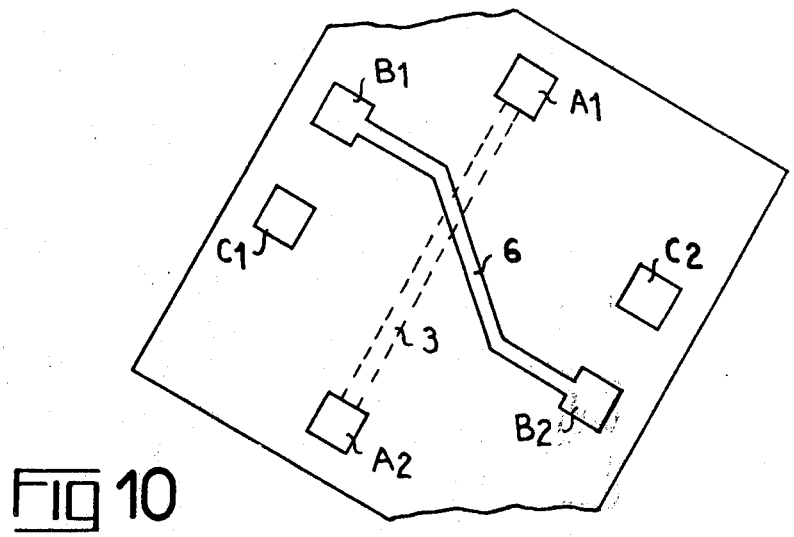

METHODS OF MANUFACTURING MULTILAYER INTERCONNECTIONS FOR INTEGRATED CIRCUITS AND TO INTEGRATED CIRCUITS UTILIZING SAID METHOD

This is a continuation of application Ser. No. 269,871 filed July 7, 1972 and which is a continuation of Ser. No. 102,379 filed Dec. 29, 1970, both of which are abandoned.

The present invention relates to improvements in methods of manufacturing multilayer interconnections for integrated circuits, and to integrated circuits whose interconnections are produced by such method.

The known methods of producing multilayer interconnections in integrated circuits consist in the successive deposition of suitably cut metal films, which serve to electrically connect the contact zones of different component, films of insulating material such as silica, silico-aluminates, etc..., interposed between the interconnecting films, in order to electrically insulate them from one another.

Generally speaking, it is necessary to provide openings in the insulating films at the location of the contact zones in order to provide electrical connections between these zones and the surface. However, it is often difficult to produce such openings in the insulating films because the materials used to produce the insulating films have high chemical resistance, this especially where the materials with the best insulating properties are concerned. Moreover, it is generally necessary to fill up the openings with a metal in order to eradicate surface irregularities.

The method of the invention, designed for the manufacture of multi layer connections for the connecting up of several groups of contact zones formed on an integrated circuit chip or wafer, is characterized in that each film of insulating material covering the semiconductor chip with the exception of the location of the contact zones, is produced by oxidation of the metal film which is protected against oxidation at the location of the contact zones to be provided.

The invention will be better understood from a consideration of the ensuing description, given by way of a non-limitative example and illustrated by following figures:

FIG. 9 is a sectional view of the chip at another stage in the execution of the method;

FIG. 10 is a plan view of the chip at a stage where two crossed interconnection films have already been produced.

FIG. 1 illustrates a chip of semiconductor material upon which there are six contact zones A1, A2, B1, B2, C1 and C2.

These contact zones belong for example to integrated subminiature circuit components which are not visible in the Figure.

A1 and A2, B1 and B2 and possibly C1 and C2 are to be electrically connected by means of conducting strips which are insulated from one another. These strips cross each other in pairs. Thus, at least at the zones of intersection, an insulating film must be arranged between them. Moreover, it is desired that at the end of the operation all the contact zones A1, A2... etc. shall be accessible at the surface.

The method of the invention makes it possible to achieve this result by the operations described hereinafter.

Figure 1:
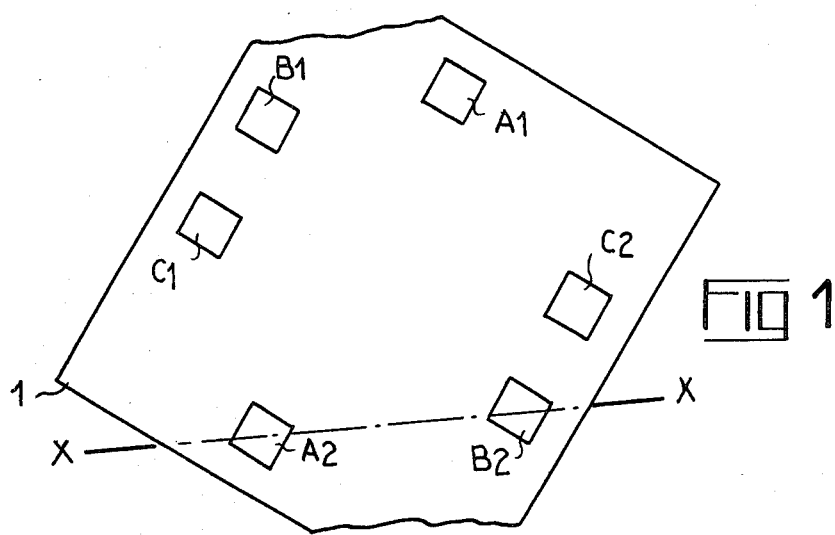
FIGS. 1, 3, 5, 7 are plan views of an integrated circuit chip during successive steps of execution of the aforesaid method.
Figure 2:
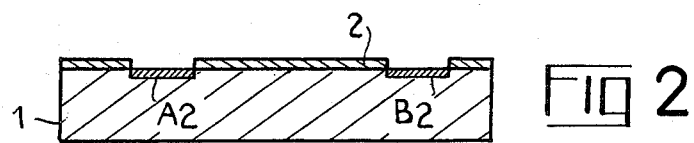
FIGS. 2, 4, 6, 8, are sectional views on the line X—X' of FIGS. 1, 3, 5, 7, respectively.

In the stages illustrated in FIG. 2, the chip 1 is covered with an insulating film 2, for example of silica, and in film openings are formed at the location of the contact zones. These operations are of current practice in the manufacture of semiconductor devices.

Figure 3:
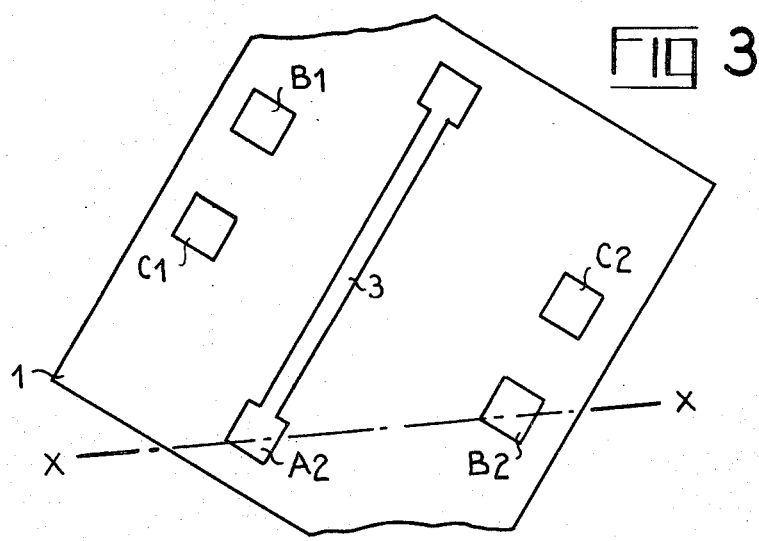
Figure 4:
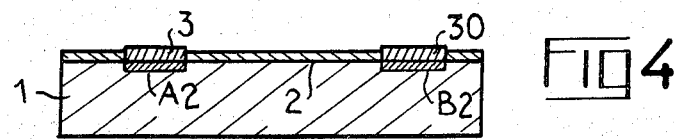

In the steps illustrated in FIGS. 3 and 4, the contact zones A1 and A2 are connected by means of a first connecting strip 3. This strip can be produced in a conventional manner; for example, it may be cut by a photoengraving technique, in an aluminium film which has previously been deposited over the whole area of the chip. By the same process, aluminium studs 30 are deposited in areas B1 (not shown in the figure,) and B2.

Figure 5:
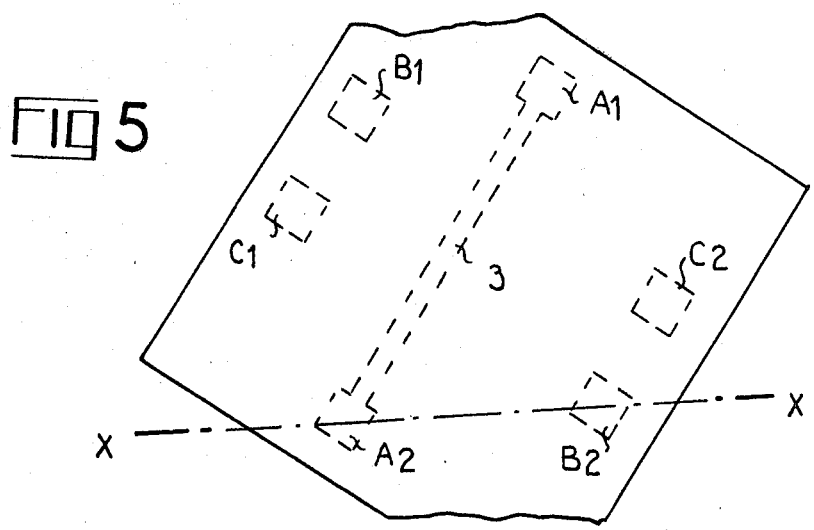
Figure 6:
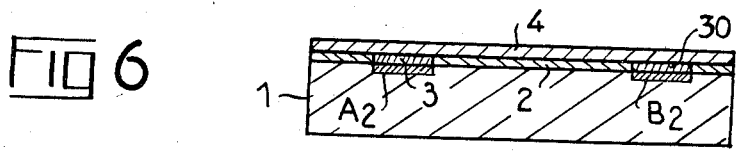

In FIGS. 5 and 6, the whole area of the chip (including the connecting strip 3), is covered by a film of a metal which by heat treatment or otherwise, can be totally oxidised to produce an insulating oxide which is virtually inert vi-a-vis the chemical agents usually used in the manufacture of semiconductor devices. Numerous metal satisfy these requirements; for example tantalum has been chosen.

Figure 7:
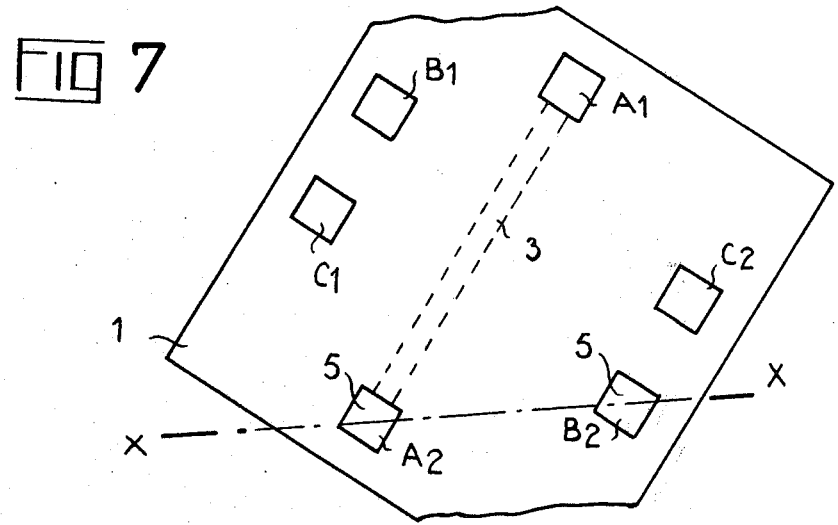
Figure 8:
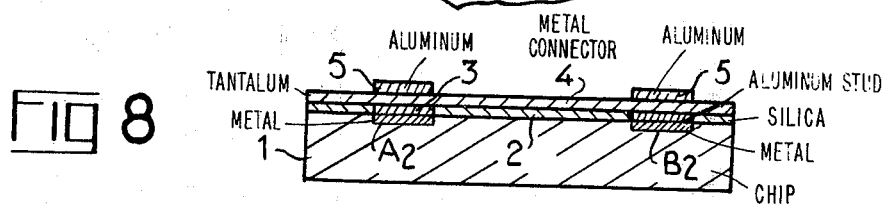

In FIGS. 7 and 8, opposite each of the contact zones A1, (not shown) A2, and B1, B2, ... the metal film 4 has been covered by a protective pill 5 in thin film form, made of a material which will prevent oxidation of the underlying metal of the film 4 at the time of the oxidising process described hereinafter. The material utilised to form these protective pills, may be a non-deteriorating metal or simply a metal which only oxidises partially under the effect of the heat treatment or other treatment which totally oxidises the tantalum. For example aluminium can be used. In this case, the protective pills 5 can be produced by the same method employed for the connecting strip 3, that is to say forming an aluminium film over the whole of the chip area and then eliminating the unwanted metal, by etching across a suitable mask.

When the chip is in the condition illustrated in FIGS. 7 and 8, it is subjected to a heat treatment or other treatment, the effect of which is to oxidise the metal of the film 4. If the film 4 is of tantalum, the chip is placed in an oven at around 500°C in an oxygen atmosphere, for a time which is selected as a function of the film thickness in order to achieve complete oxidation of the tantalum. It should be understood, however, that the tantalum only oxidises outside the protected areas, that is to say outside the contact zones which are protected by the thin-film protective pills 5.

FIG. 9 is a sectional view of the chip after this oxidising process. The plan view is the same as that shown in FIG. 7. The tantalum of the film 4 has been totally converted into tantalum oxide, a material which has excellent insulating properties, with the exception of the locations where the contact zones are disposed.

As a matter of fact, all the contact zones are covered by metal layers. Zones A by layers 1, 3, 5. Zones B are covered by the same zones. A connection 6 is thus superimposed, for connecting element $B_1$ $B_2$.

However, it may have happened that the oxidising process has partially oxidised the protective pills 5, in particular if these latter are made of aluminium. In this case, the pills can be cleaned up or de-oxidised by chemical etching. If the pills are of insulating material, this material is eliminated.

It should be noted that the first connecting strip 3, shown in FIG. 7, is embedded below the film 4 which has been rendered insulating by consequence of the oxidation.

As shown in FIG. 9 and 10, a second connecting strip 6 is then produced, linking the contact zones B1 and B2. The second strip 6 can be produced upon the oxidised film 4 by the method which has been used to produce the first strip 3 on the insulating film 2. The first and second strips are insulated from one another by the oxidised film 4 interposed between them at the location where they intersect. Moreover, all the contact areas A1, A2 . . . etc. are accessible at the surface.

If it is desired to produce a third connecting strip (not shown), insulated from the two others and linking the contact areas C1 and C2, then all that is necessary is to repeat the foregoing operations beginning from the point at which there is applied to the chip the film 4 of the metal which is to be oxidised.

In order to simplify matters, the chip which has been used to describe the method simply comprises six contact zones whose interconnections are located in three films and have a particularly simple contour.

Moreover, the method can be applied to the production of connections or networks of interconnections, on a many films as desired; for this purpose, with each new film it is merely necessary to repeat the operations which have been described from the point at which the metal film designed for subsequent oxidation, is formed. At the end of each cycle, all the contact areas are accessible at the surface.

The invention is applicable in particular to the larges-cale manufacture of integrated circuits.

What we claim is:

1. Process of manufacturing multilayer interconnection patterns for interconnecting elements integrated over the same substrate comprising the steps of:
   a. forming a contact zone for each element;
   b. depositing over said substrate a first conductive layer of a first metal, etching according to a predetermined pattern, said first layer interconnecting some of said contact zones;
   c. depositing over said conductive layer a second layer of a metal easily oxidizable by a well defined thermal treatment and that upon oxidation forms an oxide having a high resistance to chemical agents and high dielectric properties;
   d. depositing protecting studs over said second layer, said studs extending over some of said contact zones and being made of a body resistant to said thermal treatment;
   e. treating the whole assembly thermally in an oxidizing atmosphere at elevated temperature, whereby the non-protected zones of said second layer are preferentially oxidized to a non-conductive oxide and thereby forming a third dielectric layer, and the non-protected zones of said second layer are at most only partially oxidized;
   f. depositing over said assembly a third conductive layer of said resistive metal as in step (b); and
   g. etching said third layer according to a predetermined pattern thereby interconnecting some of said contact zones.

2. A process according to claims 1 wherein the oxidisable metal is tantalum.

3. A process according to claim 1, wherein said studs are made of aluminium.

* * * * *